United States Patent
Robison et al.

(10) Patent No.: US 10,884,074 B2
(45) Date of Patent: Jan. 5, 2021

(54) POWER INTERRUPT SYSTEM FOR A CONNECTOR OF A POWER SUPPLY DEVICE

(71) Applicant: Goal Zero LLC, Bluffdale, UT (US)

(72) Inventors: Sterling Robison, Cottonwood Heights, UT (US); Walker Ford, Holladay, UT (US); Keyvan Vasefi, Payson, UT (US); Norman L. Krantz, Draper, UT (US); Henry J. Howell, Herriman, UT (US)

(73) Assignee: GOAL ZERO LLC, Bluffdale, UT (US)

( * ) Notice: Subject to any disclaimer, the term of this patent is extended or adjusted under 35 U.S.C. 154(b) by 289 days.

(21) Appl. No.: 15/902,716

(22) Filed: Feb. 22, 2018

(65) Prior Publication Data

US 2018/0238954 A1   Aug. 23, 2018

Related U.S. Application Data

(60) Provisional application No. 62/462,645, filed on Feb. 23, 2017.

(51) Int. Cl.
*H02J 7/00* (2006.01)
*G01R 31/69* (2020.01)
(Continued)

(52) U.S. Cl.
CPC ............... *G01R 31/69* (2020.01); *G06F 3/01* (2013.01); *H01M 2/34* (2013.01); *H01M 10/44* (2013.01);
(Continued)

(58) Field of Classification Search
CPC ... G01R 31/69; H02J 7/35; H02J 7/342; H02J 7/0027; H02J 1/04; H02J 7/007;
(Continued)

(56) References Cited

U.S. PATENT DOCUMENTS

| 8,080,972 B2 | 12/2011 | Smith |
| 9,024,570 B2 | 5/2015 | Workman et al. |

(Continued)

FOREIGN PATENT DOCUMENTS

WO   WO-2017/118922   7/2017

OTHER PUBLICATIONS

U.S. Appl. No. 13/579,266, filed Aug. 15, 2012, Workman et al.
U.S. Appl. No. 15/902,716, filed Feb. 22, 2018, Robison et al.
U.S. Appl. No. 15/902,733, filed Feb. 22, 2018, Vasefi et al.

*Primary Examiner* — Rexford N Barnie
*Assistant Examiner* — Terrence R Willoughby
(74) *Attorney, Agent, or Firm* — Foley & Lardner LLP

(57) ABSTRACT

A power supply device includes an electrical connector and a power interrupt system. The electrical connector is configured to facilitate electrically coupling an electronic device to a power source to at least one of charge and power the electronic device. The power interrupt system selectively couples the power source to the electrical connector. The power interrupt system is configured to (a) provide energy to the electrical connector in response to at least one of (i) a first user request and (ii) a determination that the electronic device is coupled to the electrical connector, and (b) limit the energy provided to the electrical connector at least one of (i) in response to a second user request, (ii) in response to a determination that the electronic device is decoupled from the electrical connector, and (iii) after a threshold elapsed time.

18 Claims, 8 Drawing Sheets

(51) Int. Cl.
  *G06F 3/01*    (2006.01)
  *H02J 1/04*    (2006.01)
  *H01R 13/02*   (2006.01)
  *H01M 10/46*   (2006.01)
  *H01M 2/34*    (2006.01)
  *H01M 10/44*   (2006.01)
  *H01M 10/48*   (2006.01)
  *H02J 7/35*    (2006.01)
  *H02J 7/34*    (2006.01)

(52) U.S. Cl.
  CPC ......... *H01M 10/465* (2013.01); *H01M 10/48* (2013.01); *H01R 13/02* (2013.01); *H02J 1/04* (2013.01); *H02J 7/007* (2013.01); *H02J 7/0027* (2013.01); *H02J 7/342* (2020.01); *H02J 7/35* (2013.01); *H01M 2220/20* (2013.01); *H01M 2220/30* (2013.01); *H02J 7/00* (2013.01); *H02J 7/0068* (2013.01); *Y02B 40/00* (2013.01)

(58) Field of Classification Search
  CPC ........ H02J 7/00; H02J 7/0068; H01M 10/465; H01M 2/34; H01M 10/44; H01M 10/48; H01M 2220/30; H01M 2220/20; G06F 3/01; H01R 13/02; Y02B 40/90
  See application file for complete search history.

(56) References Cited

U.S. PATENT DOCUMENTS

| | | | |
|---|---|---|---|
| 9,312,706 | B2 | 4/2016 | Workman et al. |
| 9,362,766 | B2 | 6/2016 | Workman et al. |
| 9,385,351 | B2 | 7/2016 | Workman et al. |
| 9,515,500 | B2 | 12/2016 | Workman et al. |
| 9,923,393 | B2 | 3/2018 | Workman et al. |
| 9,979,215 | B2 | 5/2018 | Workman et al. |
| 2010/0080025 | A1* | 4/2010 | Terlizzi .................. H02M 1/36 363/78 |
| 2016/0198247 | A1* | 7/2016 | Cheney ................ H04R 31/006 381/334 |
| 2017/0012448 | A1* | 1/2017 | Miller .................... H02J 7/007 |
| 2018/0034015 | A1 | 2/2018 | Krantz et al. |
| 2018/0034266 | A1 | 2/2018 | Vasefi et al. |
| 2018/0034267 | A1 | 2/2018 | Vasefi et al. |

* cited by examiner

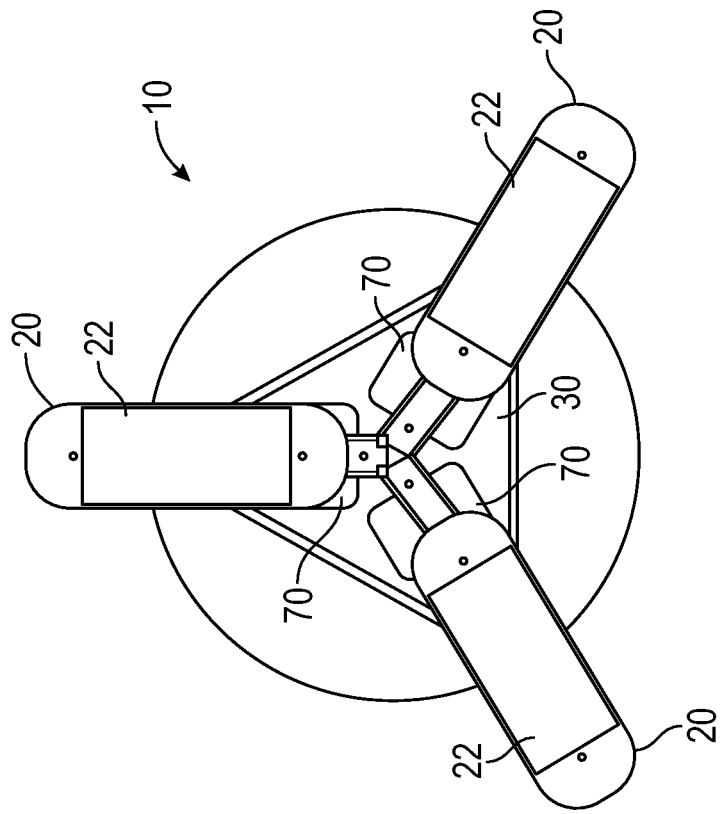
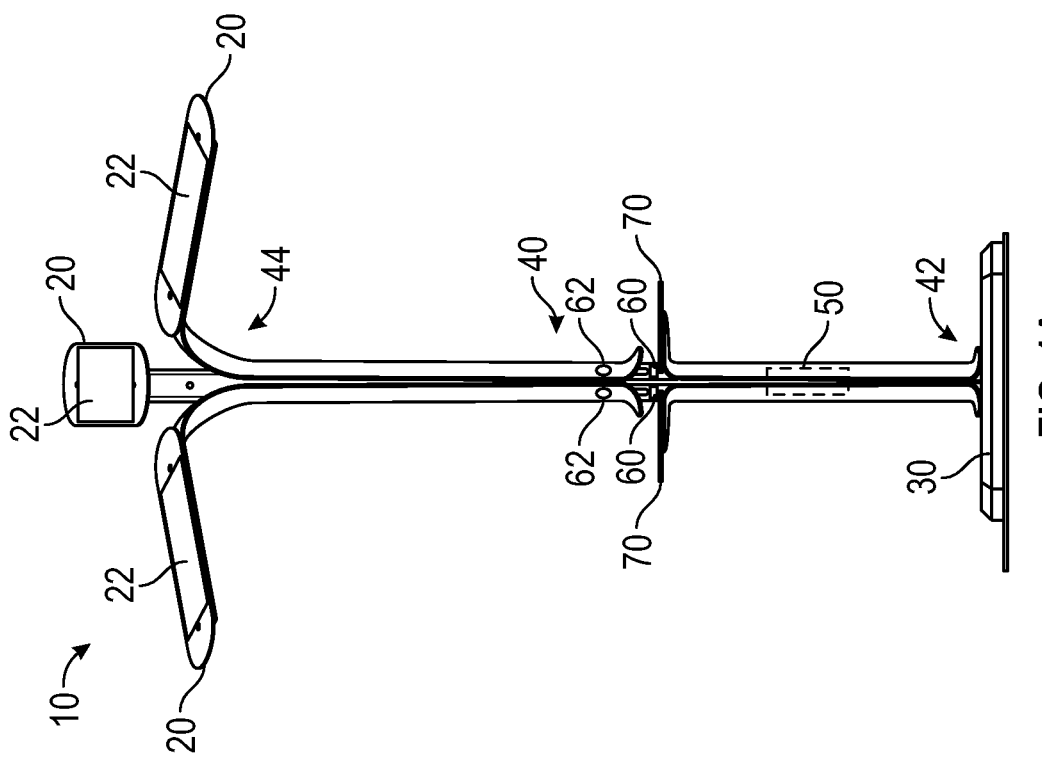
FIG. 1B
FIG. 1A

POWER INTERRUPT SYSTEM FOR A CONNECTOR OF A POWER SUPPLY DEVICE

CROSS-REFERENCE TO RELATED PATENT APPLICATIONS

This application claims the benefit of U.S. Provisional Patent Application No. 62/462,645, filed Feb. 23, 2017, which is incorporated herein by reference in its entirety.

BACKGROUND

Outdoor charging stations and portable power supply devices are configured to facilitate charging electronic devices (e.g., smartphones, tablets, etc.), including in locations where mains power may not be readily available. Such outdoor use of these devices may increase the susceptibility of electrical connectors (e.g., USB outputs, etc.) used to charge and/or power the electronic devices to corrosion (e.g., due to electrolysis when the connectors are not in use, but still live or activated).

SUMMARY

One embodiment relates to a power supply device. The power supply device includes an electrical connector and a power interrupt system. The electrical connector is configured to facilitate electrically coupling an electronic device to a power source to at least one of charge and power the electronic device. The power interrupt system selectively couples the power source to the electrical connector. The power interrupt system is configured to (a) provide energy to the electrical connector in response to at least one of (i) a first user request and (ii) a determination that the electronic device is coupled to the electrical connector, and (b) limit the energy provided to the electrical connector at least one of (i) in response to a second user request, (ii) in response to a determination that the electronic device is decoupled from the electrical connector, and (iii) after a threshold elapsed time.

Another embodiment relates to a power interrupt system for a power supply device. The power interrupt system includes a switch and a processing circuit. The switch is configured to selectively couple a power source of the power supply device to an electrical connector of the power supply device. The processing circuit is configured to activate the switch in response to receiving a first signal to couple the power source to the electrical connector such that energy from the power source is provided to the electrical connector to facilitate at least one of charging and powering an electronic device coupled to the electrical connector, and deactivate the switch in response to receiving a second signal to decouple the power source from the electrical connector such that the energy is not provided to the electrical connector from the power source.

Still another embodiment relates to a method for selectively providing power to an electrical connector of a power supply device. The method includes receiving, by a processing circuit, a first signal; activating, by the processing circuit, a switch in response to receiving the first signal; receiving, by the processing circuit, a second signal; and deactivating, by the processing circuit, the switch in response to receiving the second signal. The power supply device includes at least one of (i) an activation button configured to provide the first signal to the processing circuit in response to the activation button being engaged by a user and (ii) an engagement sensor configured to provide the first signal to the processing circuit in response to an electronic device being coupled to the electrical connector. Activating the switch couples a power source to the electrical connector such that energy from the power source is provided to the electrical connector to facilitate at least one of charging and powering the electronic device coupled to the electrical connector. At least one of (i) the activation button is configured to provide the second signal to the processing circuit in response to the activation button being disengaged by the user, (ii) the power supply device includes a current sensor configured to provide the second signal to the processing circuit in response to no current being drawn from the electrical connector, (iii) the power supply device includes a disengagement sensor configured to provide the second signal to the processing circuit in response to the electronic device being decoupled from the electrical connector, and (iv) the processing circuit is configured to start a timer in response to activating the switch. The timer is configured to provide the second signal to the processing circuit in response to the timer reaching a threshold elapsed time. Deactivating the switch decouples the power source from the electrical connector such that the energy is not provided to the electrical connector from the power source The invention is capable of other embodiments and of being carried out in various ways. Alternative exemplary embodiments relate to other features and combinations of features as may be recited herein.

BRIEF DESCRIPTION OF THE DRAWINGS

The disclosure will become more fully understood from the following detailed description, taken in conjunction with the accompanying figures, wherein like reference numerals refer to like elements, in which:

FIGS. 1A-1D are various views of a freestanding solar-powered lighting device, according to an exemplary embodiment;

DETAILED DESCRIPTION

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

According to an exemplary embodiment, a power interrupt system is configured to selectively activate (e.g., provide power to, etc.) a connector of a power supply device (e.g., a charging station, an energy storage and power supply device, etc.) to facilitate charging and/or powering an electronic device (e.g., a smartphone, a tablet, a laptop, a smartwatch, wireless headphones, a battery pack, etc.) electrically coupled thereto. In some embodiments, the power interrupt system activates the connector in response to receiving a signal from at least one of an activation button (e.g., in response to a user pressing the activation button to turn on the connector, etc.) and an engagement sensor (e.g., in response to a user plugging in an electronic device to the connector, etc.). The power interrupt system may be configured to deactivate (e.g., remove power from, etc.) the connector in response to an indication that the connector is not in use and/or after an elapsed time. By way of example, the power interrupt system may deactivate the connector in response to receiving a signal from at least one of the activation button (e.g., in response to a user pressing the activation button to turn off the connector, etc.), a current sensor (e.g., in response to a current flow no longer being drawn through the connector, etc.), a disengagement sensor (e.g., in response to a user unplugging an electronic device from the connector, etc.), and a timer (e.g., in response to a time limit expiring, etc.). Applicant has discovered that selectively providing power to the connector during use and limiting (e.g., terminating, etc.) power thereto while not in use substantially prevents corrosion and/or degradation of the connector. By way of example, the power supply device may be configured for outdoor use. Maintaining the connector in an active or live state while not in use may cause and/or increase electrolysis experienced by the connector. Deactivating the connector while not in use advantageously prevents electrolysis such that the connector does not experience (or experiences substantially reduced) corrosion.

Figure 1D:
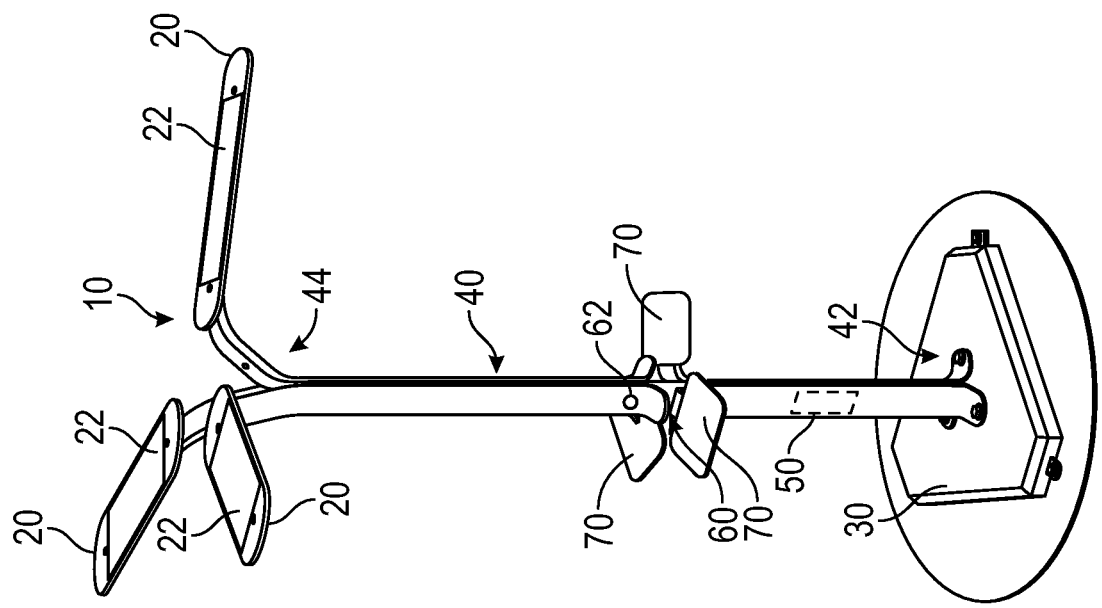

According to the exemplary embodiment shown in FIGS. 1A-1D, a first power supply device (e.g., a solar-powered charging station, etc.), shown as charging station 10, includes a plurality of panels, shown as panels 20, coupled to a base, shown as baseplate 30, with a substantially vertical frame member, shown as frame member 40. In one embodiment, the panels 20 include bent aluminum plates. The charging station 10 provides a station at which users may charge their portable electronic devices or perform other tasks, according to an exemplary embodiment. While shown in FIGS. 1A-1D as substantially vertical, it should be understood that, according to alternative embodiments, the frame member 40 may be angled or otherwise positioned. As shown in FIG. 1D, the frame member 40 includes a first end, shown as lower end 42, and an opposing second end, shown as upper end 44. The lower end 42 is coupled to and extends from the baseplate 30. The panels 20 are coupled to the upper end 44 of the frame member 40, according to an exemplary embodiment. The baseplate 30 may be weighted to further stabilize the frame member 40 and the panels 20. In other embodiments, the baseplate 30 has a shape (e.g., a diameter, etc.) or includes a feature (e.g., cleats, a rubberized bottom) intended to further stabilize and/or reduce the movement of the frame member 40 and the panels 20. In other embodiments, the charging station 10 does not include the baseplate 30, and the frame member 40 couples the panels 20 directly to a support surface (e.g., a floor, a sidewalk, using fasteners, embedded within the support surface, etc.).

As shown in FIGS. 1A-1D, the charging station 10 is a freestanding unit capable of supporting the panels 20 without external support members. The charging station 10 may be positioned in various locations without relying upon surrounding structures for support and/or power. By way of example, the charging station 10 may be positioned in any of a wide variety of public, commercial, and/or outdoor locations and applications where sunlight is readily available, such as (but not limited to) street corners, atriums, parks, outdoor markets, school and/or college campuses, business parks, etc. without requiring any support from external frame members or devices. In one embodiment, only the support surface (e.g., floor, sidewalk, boardwalk, etc.) below the baseplate 30 supports the charging station 10.

Figure 1C:
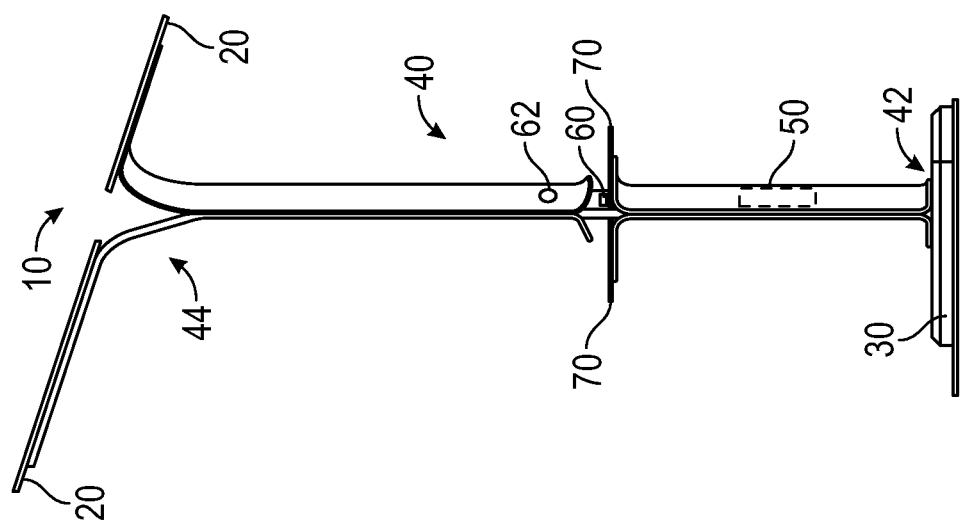

Referring still to the exemplary embodiment shown in FIGS. 1A-1D, the panels 20 have upper surfaces and bottom surfaces. Photovoltaic cell assemblies, shown as solar panels 22, are disposed on the panels 20. In one embodiment, the solar panels 22 define a portion of the upper surfaces of the panels 20. In another embodiment, the solar panels 22 are coupled to the upper surfaces of the panels 20. The solar panels 22 may be positioned at least 100 inches (e.g., 118 inches) above a ground surface below the baseplate 30. According to the exemplary embodiment shown in FIG. 1C, the upper surfaces of the panels 20 are substantially coplanar and angled relative to the frame member 40 (e.g., relative to a central axis defined by the frame member 40, etc.). Angling the upper surfaces of the panels 20 may increase (e.g., maximize, etc.) an incidence of solar irradiation on the solar panels 22. Increasing the incidence of solar irradiation increases the electricity generated by the solar panels 22 and improves the efficiency of the charging station 10, according to an exemplary embodiment. As shown in FIG. 1C, the panels 20 are tilted at a common angle relative a central axis defined by the frame member 40 when the charging station 10 is viewed in a side profile. The angle of the panels 20 is tailored for a particular location, venue, application, or surrounding environment, according to an exemplary embodiment. By way of example, the angle may be greater where a building to one side of the charging station 10 obstructs solar irradiation duration a portion of the day. In some embodiments, the angle is adjustable. By way of example, the angle may be manually adjustable and/or may be automatically adjusted (e.g., using an actuator and controller to follow the path of the sun, etc.).

As shown in FIGS. 1A, 1C, and 1D, the charging station 10 includes a storage device, shown as energy storage device 50. In other embodiments, the charging station 10 does not include the energy storage device 50 (e.g., the device may include an inlet configured to engage a mains power supply, solar panels 22 may be directly coupled to a connector, etc.). According to an exemplary embodiment, the energy storage device 50 is electrically coupled to the solar panels 22. The energy storage device 50 includes batteries, according to an exemplary embodiment, that may be charged using the solar panels 22. Accordingly, solar energy may be stored for later use. By way of example, the stored solar energy may be used at dusk, nighttime, and/or other periods of lower solar exposure (e.g., on cloudy days or during cloudy periods of the day, etc.). Solar panels 22 may otherwise directly selectively power a connector used to charge portable electronic devices. As shown in FIGS. 1A-1D, the energy storage device 50 is disposed within the frame member 40. In other embodiments, the energy storage device 50 is positioned within another portion of the charging station 10 (e.g., within a portion of the baseplate 30, within one or more the panels 20, etc.).

According to an exemplary embodiment, the charging station 10 facilitates charging consumer electronic devices without any electrical connections to an external power source (e.g., to the electrical grid). In an alternative embodiment, the charging station 10 is electrically coupled to mains power (e.g., the electrical grid, etc.). In such embodiments, the charging station 10 may or may not include the panels 20 and/or the solar panels 22.

As shown in FIGS. 1A, 1C, and 1D, the charging station 10 includes a plurality of connectors, shown as electrical connectors 60, and a plurality of platforms, shown as platforms 70. The electrical connectors 60 may be supported by the frame member 40 and electrically coupled to the energy storage device 50, the solar panels 22, and/or a mains power source with wiring and suitable circuitry (e.g., rectifiers, etc.). In one embodiment, the electrical connectors 60 include a variety of AC and/or DC receptacles (depending on the application for the intended location) and are configured to engage one or more of a plurality of consumer electronic devices (e.g., a smartphone, a tablet, an E-reader, a computer, a laptop, a smartwatch, a portable and rechargeable battery pack, etc.) directly or indirectly (e.g., with a power cord, etc.) for charging and/or operating the consumer electronic devices. According to an exemplary embodiment, the electrical connectors 60 include a plurality of female electrical elements (e.g., micro USB ports, USB ports, USB-C ports, standard electrical outlets, alternating current ("AC") inverter ports, direct current ("DC") ports, a 6 millimeter ("mm") port, a 12V car port, etc.). According to an alternative embodiment, the electrical connectors 60 include a plurality of male electrical elements (e.g., a micro USB connector, a USB-C connector, a USB connector, a standard electrical plug end, a lighting connector, a 30-pin connector, etc.). According to still another alternative embodiment, the electrical connectors 60 include both female and male electrical elements. The female and/or the male electrical elements may be substantially fixed to a portion of the charging station 10 (e.g., the frame member 40, the platforms 70, etc.), may be provided at the end of a length of cable so that the electrical connectors 60 may be selectively deployed from a pocket or other receptacle within a portion of the charging station 10 (e.g., the frame member 40, the platforms 70, etc.), or a combination thereof. In still other embodiments, the electrical connectors 60 include a 'multi-standard' plug that is configured to receive any of a wide variety of electric plug configurations (such as the various types of AC power cords associated with the AC electric power systems of different countries), or other plug configurations such as 12 VDC cigarette lighter plugs, 12 VDC barrel plugs, various smartphone plugs, and the like. In one embodiment, the electrical connectors 60 are plated to improve the weather resistance (i.e., weather proofing) of the electrical connectors 60.

According to an exemplary embodiment, the platforms 70 are configured to support consumer electronic devices, provide a workspace upon which users may work, or a combination thereof. In other embodiments, at least one platform 70 includes at least a portion of energy storage device 50. By way of example, a battery pack may be coupled to a bottom side of the platform 70. In one embodiment, the platforms 70 are coupled to the frame member 40 and disposed proximate the plurality of electrical connectors 60. As shown in FIGS. 1A-1D, the three platforms 70 are positioned proximate to three corresponding electrical connectors 60. Accordingly, users charging consumer electronic devices may rest their devices upon the platforms 70 (e.g., while waiting for the consumer electronic device to charge, etc.).

As shown in FIGS. 1A, 1C, and 1D, the charging station 10 includes a plurality of buttons, shown as activation buttons 62. According to an exemplary embodiment, each of the activation buttons 62 is electrically coupled to a controller and/or a respective electrical connector 60. The activation buttons 62 may be part of a power interrupt system of the charging station 10. The activation buttons 62 may be configured to receive user input based upon which the power interrupt system provides energy (e.g., from the solar panels 22, from the energy storage device 50, from the mains power, etc.) to the electrical connectors 60. By way of example, the power interrupt system may maintain the electrical connectors 60 in an inactive mode, where no energy is provided to the electrical connectors 60, until the activation button 62 of a respective electrical connector 60 is engaged (e.g., depressed by a user, etc.). The power interrupt system may be configured to activate one or more of the electrical connectors 60 in response to an associated activation button 62. In other embodiments, the charging station 10 does not include the activation buttons 62.

Figure 2A:
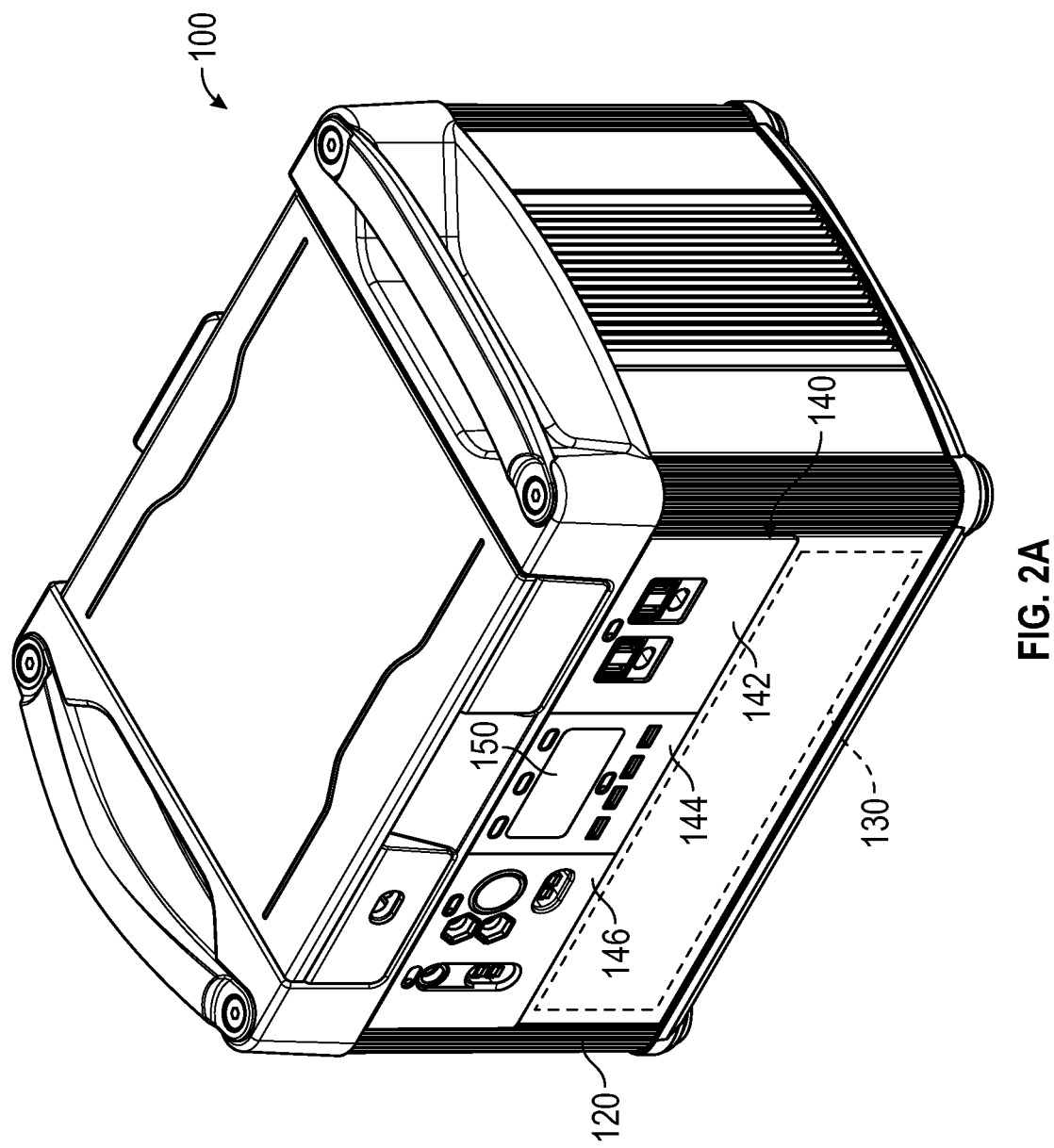
FIGS. 2A and 2B are various views of an energy storage and power supply device, according to an exemplary embodiment.
Figure 2B:
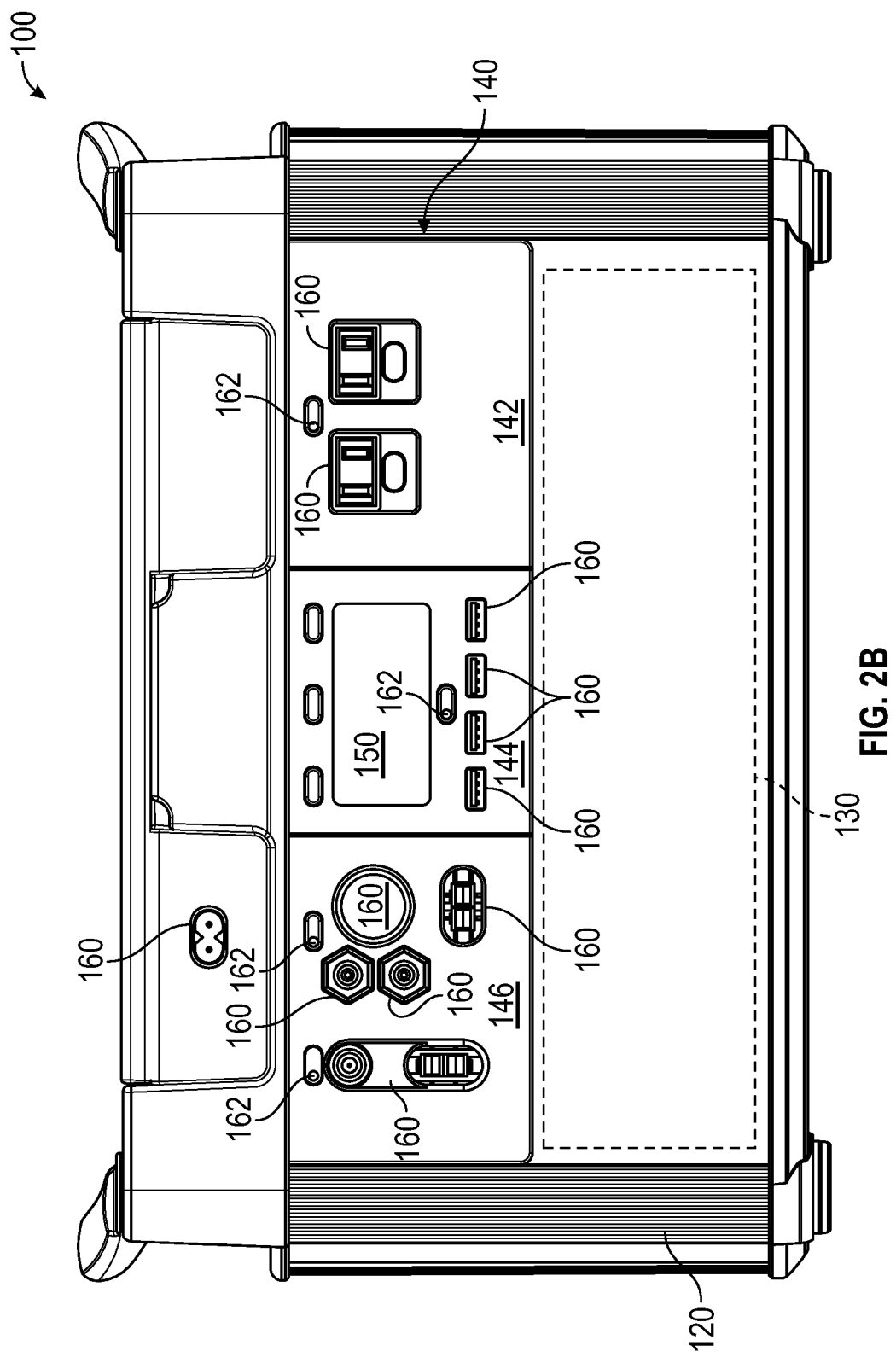

According to the exemplary embodiment shown in FIGS. 2A and 2B, a second power supply device (e.g., a solar generator, a hybrid combustion and solar generator, etc.), shown as energy storage and power supply device 100, is configured to receive and store electrical power from a power source for future use (e.g., in a remote location where electricity is not readily available, during a power outage, etc.). The power source may include a solar panel system, a combustion generator (e.g., a gasoline-fueled generator, etc.), a power supply (e.g., a 120 Volt ("V") wall charger, a 220V wall charger, a 240V wall charger, etc.), and/or a 12V car adapter. The stored electrical power may be provided to one or more electronic devices (e.g., a smartphone, a tablet, an E-reader, a computer, a laptop, a smartwatch, a portable and rechargeable battery pack, appliances, refrigerators, lights, display monitors, televisions, etc.) to at least one of charge and power the electronic devices.

As shown in FIGS. 2A and 2B, the energy storage and power supply device 100 includes a housing, shown as housing 120. As shown in FIGS. 2A and 2B, the energy storage and power supply device 100 includes an energy storage device, shown as battery 130. According to an exemplary embodiment, the housing 120 defines an internal cavity of the energy storage and power supply device 100 that receives the battery 130. The battery 130 may include one or more lithium-ion cells. In some embodiments, the battery 130 includes a plurality of batteries (e.g., two or more batteries connected in series, etc.). In some embodiments, the battery 130 additionally or alternatively includes another type of battery (e.g., a lead-acid battery, etc.) or energy storage unit (e.g., one or more capacitors, etc.).

As shown in FIGS. 2A and 2B, the energy storage and power supply device 100 includes an interface, shown as user interface 140. The user interface 140 includes a first portion, shown as first panel 142, a second portion, shown as second panel 144, and a third portion, shown as third panel 146. As shown in FIG. 2B, the first panel 142 includes a first plurality of interfaces, the second panel 144 includes a second plurality of interfaces, and the third panel 146 includes a third plurality of interfaces, shown as electrical connectors 160. The electrical connectors 160 are electrically coupled to the battery 130, according to an exemplary embodiment. According to an exemplary embodiment, (i) at least a portion of the electrical connectors 160 are configured to receive electrical energy from a power source (e.g., a solar panel system, a combustion generator, a power supply, a 12V car adapter, etc.) for storage by the battery 130, (ii) at least a portion of the electrical connectors 160 are configured to provide the stored electrical energy within the battery 130 to an electronic device (e.g., a smartphone, a tablet, an E-reader, a computer, a laptop, a smartwatch, a portable and rechargeable battery pack, appliances, a refrigerator, lights, display monitors, televisions, etc.) with a power and/or charging cable connected therebetween, and/or (iii) at least a portion of the electrical connectors 160 are configured to receive and provide electrical energy (e.g., operate as dual functioning ports, etc.).

According to the exemplary embodiment shown in FIG. 2B, the electrical connectors 160 of the first panel 142, the second panel 144, and the third panel 146 include alternating current ("AC") inverter ports (e.g., having a 110V outlet port, etc.), direct current ("DC") inputs and/or outputs, USB ports (e.g., standard USB, micro USB, USB-C, etc.), a 6 millimeter ("mm") port, a 12V car port, a 12V powerpole port (e.g., an Anderson Powerpole, etc.), a charging port (e.g., a solar panel charging port, a combustion generator charging port, a power supply charging port, a powerpole charging port, etc.), and/or a chaining port (e.g., to electrically couple two or more of the energy storage and power supply devices 100 in series or parallel, a powerpole chaining port, etc.).

As shown in FIGS. 2A and 2B, the second panel 144 includes a display, shown as display 150. The display 150 may provide various information regarding the state and/or operation of the energy storage and power supply device 100 and/or the battery 130 (e.g., a battery level, a current input power, a current input voltage, a current input current, a current output power, a current output voltage, a current output current, an estimated time until a full charge of the battery 130 is reached, an estimated time until full and/or permitted depletion of the battery 130 is reached, a battery temperature, an insignia, a notification, a warning, etc.).

As shown in FIG. 2B, the energy storage and power supply device 100 includes a plurality of buttons, shown as activation buttons 162. According to an exemplary embodiment, each of the activation buttons 162 is electrically coupled to a controller and/or a respective electrical connector 160. The activation buttons 162 may be part of a power interrupt system of the energy storage and power supply device 100. The activation buttons 162 may be configured to receive user input based upon which the power interrupt system provides energy (e.g., from the battery 130, etc.) to the electrical connectors 160. By way of example, the power interrupt system may maintain the electrical connectors 160 in the inactive mode, where no energy is provided to the electrical connectors 160, until an activation button 162 of a respective electrical connector 160 is engaged (e.g., depressed by a user, etc.). The power interrupt system may be configured to activate one or more of the electrical connectors 160 in response to an associated activation button 162. In other embodiments, the energy storage and power supply device 100 does not include the activation buttons 162.

Figure 3:
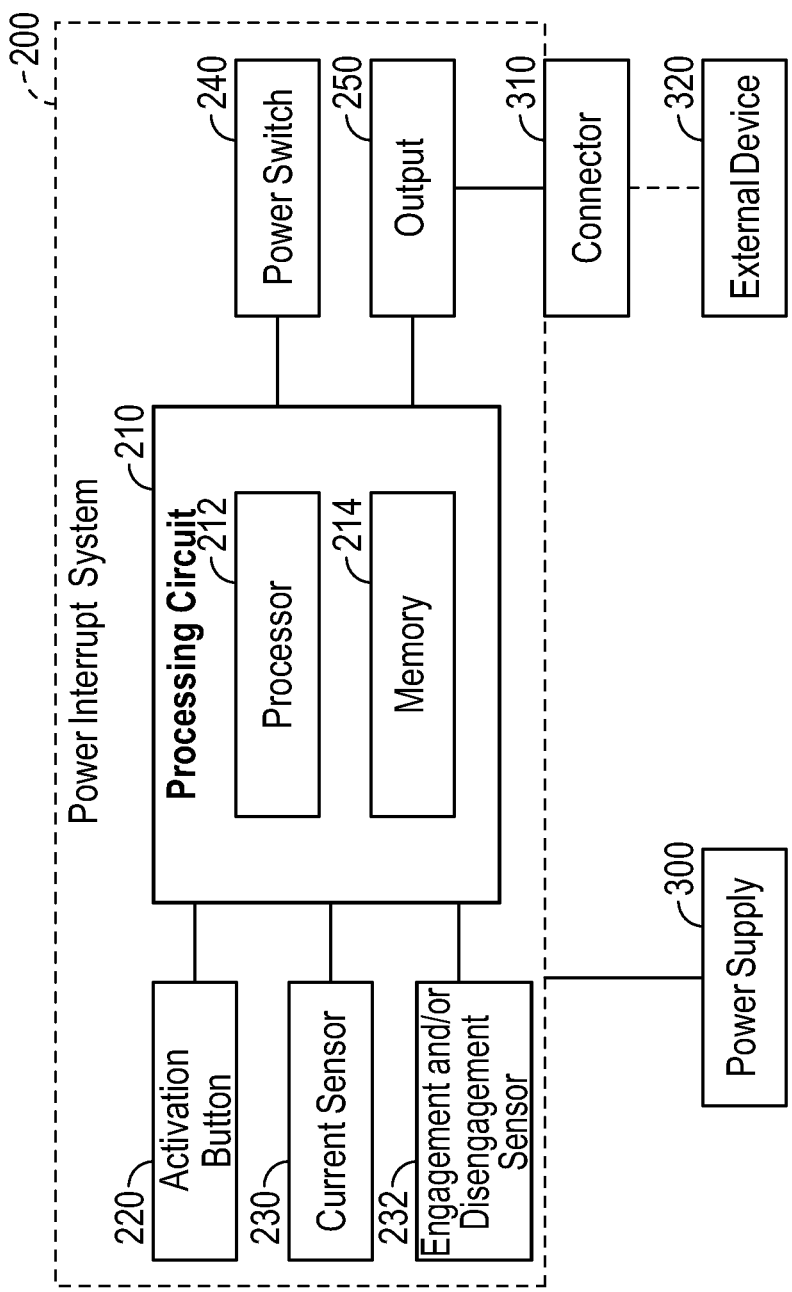
FIG. 3 is a schematic diagram of a power interrupt system of the solar-powered charging system of FIGS. 1A-1D and/or the energy storage and power supply of FIGS. 2A and 2B, according to an exemplary embodiment.
Figure 4A:
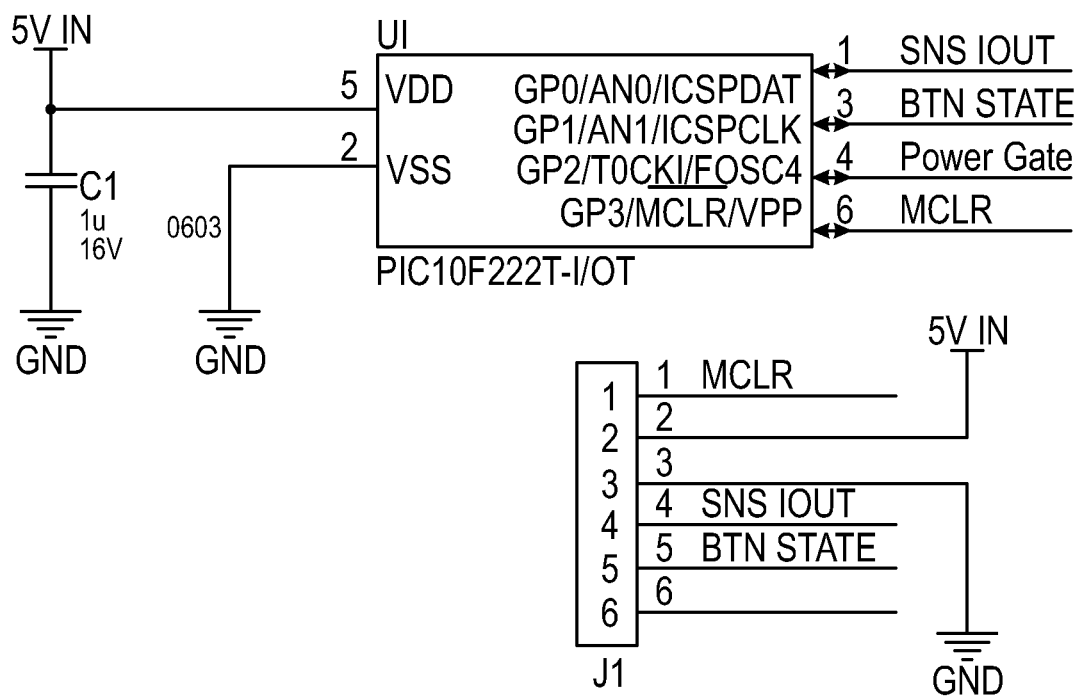
FIGS. 4A-4G are various circuit diagrams of components of the power interrupt system of FIG. 3, according to an exemplary embodiment.
Figure 4B:
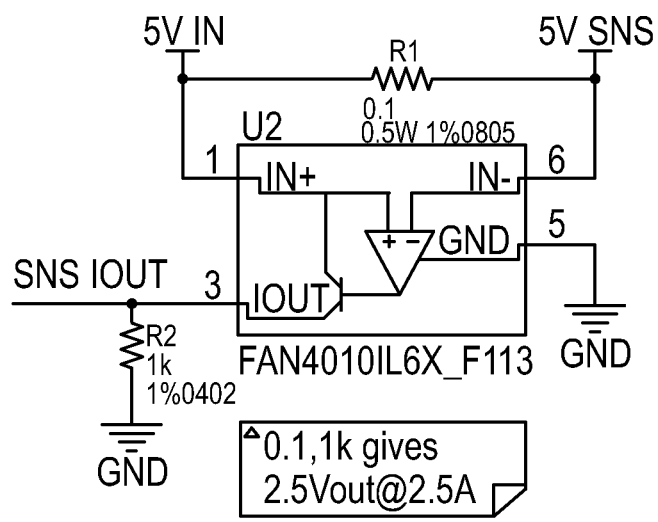
Figure 4C:
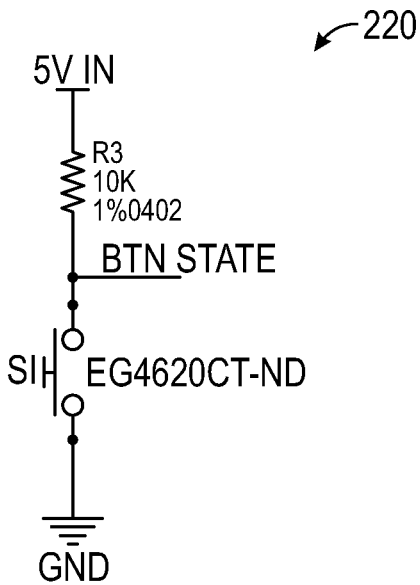
Figure 4D:
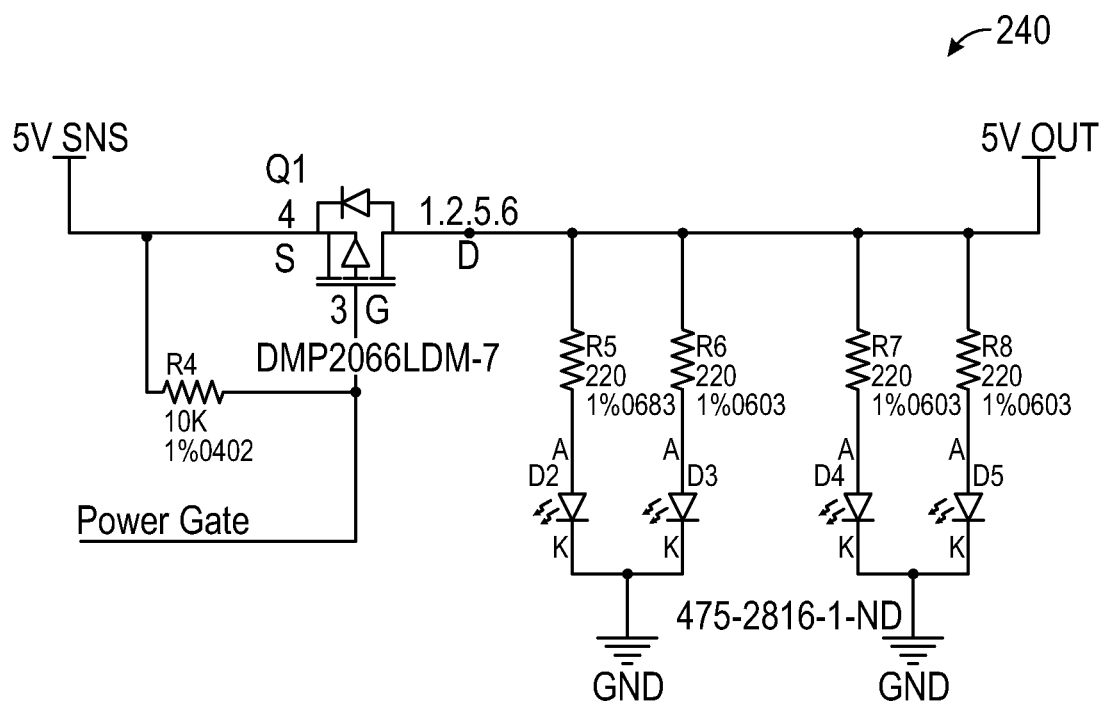
Figure 4E:
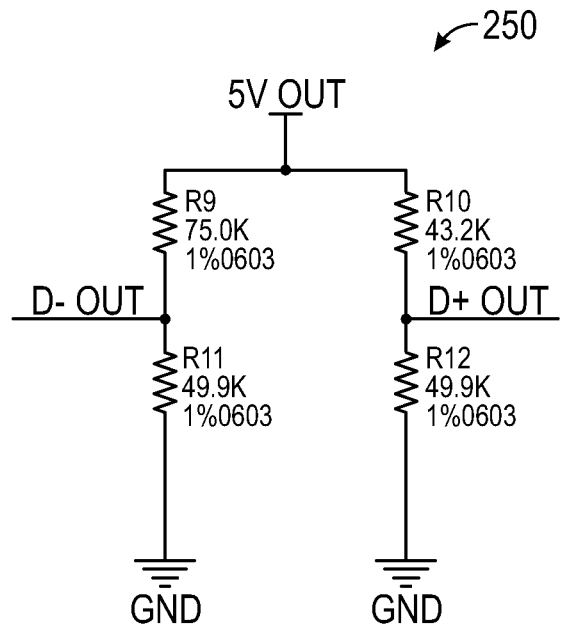
Figure 4F:
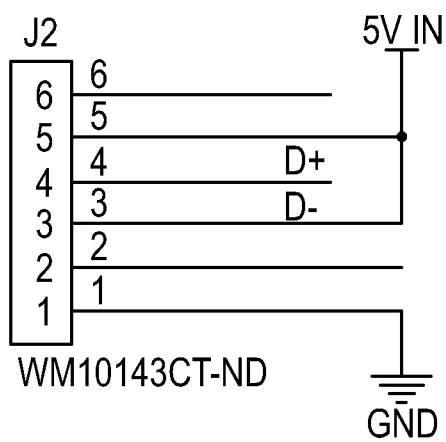
Figure 4G:
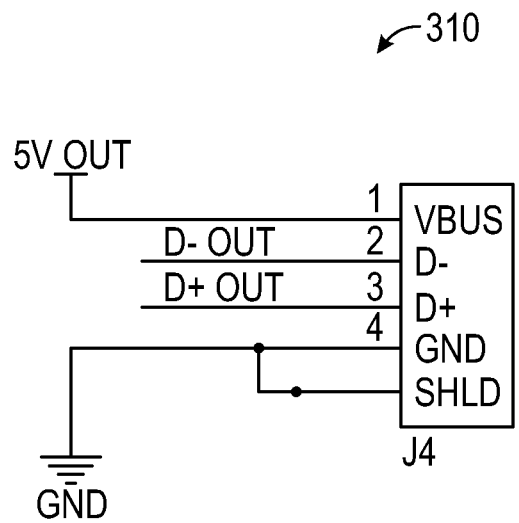

According to an exemplary embodiment, the charging station 10 and/or the energy storage and power supply device 100 include a power interrupt system, shown in FIG. 3 as power interrupt system 200. According to an exemplary embodiment, the power interrupt system 200 is configured to activate (e.g., provide power to, etc.) the electrical connectors 60 of the charging station 10 and/or the electrical connectors 160 of the energy storage and power supply device 100 in response to a user request (e.g., a user plugging in a power cord of an electronic device into the connector 160, a user plugging the connector 160 of a power cord into the electronic device, a user pressing an activation button to turn on a respective connector, etc.). The power interrupt system 200 may additionally be configured to deactivate (e.g., remove power from, etc.) the electrical connectors 60 and/or the electrical connectors 160 while not in use and/or after use (e.g., when a user is not charging an electronic device, in response to a user decoupling a power cord of an electronic device from the connector 160, in response to a user unplugging the connector 160 of a power cord from the electronic device, in response to a user pressing an activation button to turn off a respective connector, etc.). Selectively providing power to the electrical connectors 60 and/or the electrical connectors 160 during use, and while not in use, may substantially prevent corrosion and/or degradation of the electrical connectors 60 and/or the electrical connectors 160. By way of example, the charging station 10 and/or the energy storage and power supply device 100 may be configured for outdoor use. Maintaining the electrical connectors 60 and/or the electrical connectors 160 in an active or live state while not in use may cause and/or increase electrolysis experienced by the electrical connectors 60 and/or the electrical connectors 160. The process of electrolysis may cause the electrical connectors 60 and/or the electrical connectors 160 to experience corrosion. The power interrupt system 200, by deactivating the electrical connectors 60 and/or the electrical connectors 160 while not in use, may thereby advantageously prevent electrolysis such that the electrical connectors 60 and/or the electrical connectors 160 do not experience corrosion, extending the useful lives thereof.

As shown in FIG. 3, the power interrupt system 200 includes a processing circuit 210, an activation button 220 (e.g., the activation button 62 of the charging station 10, the activation button 162 of the energy storage and power supply device 100, etc.), a current sensor 230, an engagement and/or disengagement sensor 232, a power switch 240, and an output 250. In some embodiments, the power interrupt system 200 does not include the activation button 220. In some embodiments, the power interrupt system 200 does not include the current sensor 230. The engagement and/or disengagement sensor 232 may be a single sensor or two independent sensors (e.g., an engagement sensor and a disengagement sensor, etc.). In some embodiments, the power interrupt system 200 does not include the engagement and/or disengagement sensor 232. As shown in FIG. 3, the power interrupt system 200 is coupled (e.g., electrically coupled, etc.) to a power source, shown as power supply 300. The power supply 300 may be or include the energy storage device 50, the solar panels 22, an input configured to engage a mains power source (e.g., a 120 Volt ("V") wall charger, a 220V wall charger, a 240V wall charger, etc.), the battery 130, a solar generator, and/or a combustion generator (e.g., a gasoline-fueled generator, etc.). The power supply 300 may be configured to at least one of generate, store, and transmit energy. The power interrupt system 200 may be selectively coupled to the power supply 300 (e.g., a detachable battery, using a wall plug, etc.) and/or integrally coupled to the power supply 300 (e.g., a hardwired power supply such as solar panels, internally fixed battery packs, etc.). As shown in FIG. 3, the power interrupt system 200 is coupled to an electrical connector, shown as connector 310. The connector 310 may be or include the electrical connectors 60 of the charging station 10 and/or the electrical connectors 160 of the energy storage and power supply device 100. According to the exemplary embodiment shown in FIG. 3, the connector 310 is configured to facilitate selectively coupling one or more external devices (e.g., electronic devices, user devices, etc.), shown as external devices 320, to the power interrupt system 200 and the power supply 300 to power and/or charge the external devices 320 (e.g., with a power cable or cord for the external device 320, etc.).

According to an exemplary embodiment, the activation button 220 is configured to facilitate receiving a user input to activate a desired connector 310 to charge and/or power the external device 310. In one embodiment, the activation button 220 is a two-way button that may provide a signal in response to being pressed a first time, in response to which the processing circuit 210 may activate the respective connector 310 (e.g., to start a power flow thereto, etc.) and provide a second signal (e.g., no signal, zero voltage, etc.) in response to being pressed a second time, in response to which the processing circuit 210 may deactivate the respective connector 310 (e.g., to stop the power flow thereto, etc.). In another embodiment, the activation button 220 is a one-way button that in pressed to activate the desired connector 310 and then returns to a nominal position. In such an embodiment, the processing circuit 210 may determine when to deactivate the respective connector 310 (e.g., in response to an indication a current flow to the connector 310 has stopped for a threshold period of time, in response to an indication that a charging/power cable of the external device 320 has been disengaged from the connector 310, etc.).

According to an exemplary embodiment, the current sensor 230 is positioned and/or configured to acquire current data regarding a current flow from the output 250 to the connector 310. In some embodiments, the power interrupt system 200 additionally or alternatively includes the engagement and/or disengagement sensor 232 positioned and/or configured to facilitate recognizing when an external device 320 is coupled to and/or disengaged from a respective connector 310 (e.g., other than based on current flow, a contact sensor, etc.). The processing circuit 210 may control operation of the power switch 240 based on information received from the sensors. According to an exemplary embodiment, the power switch 240 is configured to facilitate selectively reducing (e.g., preventing, limiting, etc.) power flow to the output 250 and/or the connector 310. By way of example, the power switch 240 may be positioned to facilitate selectively decoupling (e.g., using an on/off switch, etc.) the output 250 from the power supply 300 such that the connector 310 may be operated in either a live state or a deactivated state (e.g., such that the connector 310 is not live and receiving power when not being used, etc.).

The processing circuit 210 includes a processor 212 and a memory 214 (e.g., RAM, ROM, Flash Memory, hard disk storage, etc.). The processor 212 may be implemented as a general-purpose processor, an application specific integrated circuit ("ASIC"), one or more field programmable gate arrays ("FPGAs"), a digital signal processor ("DSP"), a group of processing components, or other suitable electronic processing components. The memory 214 may include multiple memory devices. The memory 214 may store data and/or computer code for facilitating the various processes described herein. Thus, the memory 214 may be communicably connected to the processor 212 and provide computer code or instructions to the processor 212 for executing the processes described in regard to the processing circuit 210 herein. Moreover, the memory 214 may be or include tangible, non-transient volatile memory or non-volatile memory. Accordingly, the memory 214 may include database components, object code components, script components, or any other type of information structure for supporting the various activities and information structures described herein.

In one embodiment, the processing circuit 210 is configured to control operation of the power switch 240 based on an input provided by the activation button 220. By way of example, the activation button 220 may be a two-way button that when pressed a first time (e.g., indicating that that a user desires to use an associated connector 310, etc.), the processing circuit 210 may send a first signal to the power switch 240 to activate the connector 310 such that the output 250 provides power from the power supply 300 to the connector 310. Additionally, the activation button 220 may be pressed a second time (e.g., indicating that that a user is no longer using the associated connector 310, etc.). The processing circuit 210 may send a second signal to the power switch 240 to deactivate the connector 310 such that the output 250 no longer provides power from the power supply 300 to the connector 310. In some embodiments, the processing circuit 210 is configured to receive current data from the current sensor 230 and determine whether current is no longer being drawn from the connector 310 (e.g., indicating that the external device 320 was decoupled from the connector 310 or is fully charged, etc.). The processing circuit 210 may be configured to send the second signal to the power switch 240 to deactivate the connector 310 in response to determining, based on the current data, that a user removed the external device 320 from the connector 310 without pressing the activation button 220 to deactivate the connector 310. The processing circuit 210 may be configured to wait a threshold elapsed time (e.g., ten seconds, one minute, etc.) before deactivating the connector 310.

In another embodiment, the processing circuit 210 is configured to control operation of the power switch 240 based on signals received from the activation button 220 and the current sensor 230. By way of example, the activation button 220 may be a one-way button that when pressed (e.g., indicating that that a user desires to use an associated connector 310, etc.), the processing circuit 210 may send a first signal to the power switch 240 to activate the connector 310 such that the output 250 provides power from the power supply 300 to the connector 310. The processing circuit 210 may be configured to also receive current data from the current sensor 230 and determine whether current is no longer being drawn from the connector 310 (e.g., the external device 320 was decoupled from the connector 310, etc.). The processing circuit 210 may be configured to send a second signal to the power switch 240 to deactivate the connector 310 in response to determining, based on the current data, that a user removed the external device 320 from the connector 310. The processing circuit 210 may be configured to wait a threshold elapsed time (e.g., ten seconds, one minute, etc.) before deactivating the connector 310.

In yet another embodiment, the processing circuit 210 is configured to control operation of the power switch 240 based on signals received from the activation button 220 and a disengagement sensor (e.g., the engagement and/or disengagement sensor 232, etc.). By way of example, the activation button 220 may be a one-way button that when pressed (e.g., indicating that that a user desires to use an associated connector 310, etc.), the processing circuit 210 may send a first signal to the power switch 240 to activate the connector 310 such that the output 250 provides power from the power supply 300 to the connector 310. The processing circuit 210 may be configured to also receive a disengagement signal from the disengagement sensor and determine that the external device 320 was decoupled from the connector 310. The processing circuit 210 may be configured to send a second signal to the power switch 240 to deactivate the connector 310 in response to receiving the disengagement signal and/or determining that the external device 320 was decoupled. The processing circuit 210 may be configured to wait a threshold elapsed time (e.g., ten seconds, one minute, etc.) before deactivating the connector 310.

In still another embodiment, the processing circuit 210 is configured to control operation of the power switch 240 based on signals received from the activation button 220 and a timer. By way of example, the activation button 220 may be a one-way button that when pressed (e.g., indicating that that a user desires to use an associated connector 310, etc.), the processing circuit 210 may send a first signal to the power switch 240 to activate the connector 310 such that the output 250 provides power from the power supply 300 to the connector 310. The processing circuit 210 may be configured to start a timer in response to the indication that a user has pressed the activation button 220. The processing circuit 210 may be configured to send a second signal to the power switch 240 to deactivate the connector 310 in response to the timer exceeding a threshold time or expiring (e.g., five minutes, ten minutes, etc.).

In still another embodiment, the processing circuit 210 is configured to control operation of the power switch 240 based on signals received from an engagement sensor (e.g., the engagement and/or disengagement sensor 232, etc.) and the current sensor 230. By way of example, the processing circuit 210 may be configured to receive an engagement signal from the engagement sensor and determine that the external device 320 is coupled from the connector 310. The processing circuit 210 may send a first signal to the power switch 240 to activate the connector 310 such that the output 250 provides power from the power supply 300 to the connector 310 in response to receiving the engagement signal and/or determine that the external device 320 is engaged. The processing circuit 210 may be configured to receive current data from the current sensor 230 and determine whether current is no longer being drawn from the connector 310 (e.g., the external device 320 was decoupled from the connector 310, etc.). The processing circuit 210 may be configured to send a second signal to the power switch 240 to deactivate the connector 310 in response to the current data indicating that a user removed the external device 320 from the connector 310. The processing circuit 210 may be configured to wait a threshold elapsed time (e.g., ten seconds, one minute, etc.) before deactivating the connector 310.

In still another embodiment, the processing circuit 210 is configured to control operation of the power switch 240 based on signals received from an engagement sensor (e.g., the engagement and/or disengagement sensor 232, etc.) and a timer. By way of example, the processing circuit 210 may be configured to receive an engagement signal from the engagement sensor and determine that the external device 320 is coupled from the connector 310. The processing circuit 210 may send a first signal to the power switch 240 to activate the connector 310 such that the output 250 provides power from the power supply 300 to the connector 310 in response to receiving the engagement signal and/or determining that the external device 320 is engaged. The processing circuit 210 may be configured to start a timer in response to the engagement sensor indicating engagement. The processing circuit 210 may be configured to send a second signal to the power switch 240 to deactivate the connector 310 in response to the timer exceeding a threshold time or expiring (e.g., five minutes, ten minutes, etc.).

In still another embodiment, the processing circuit 210 is configured to control operation of the power switch 240 based on signals received from an engagement sensor and a disengagement sensor (e.g., the same sensor, multiple sensors, the engagement and/or disengagement sensor 232, etc.). By way of example, the processing circuit 210 may be configured to receive an engagement signal from the engagement sensor and determine that the external device 320 is coupled from the connector 310. The processing circuit 210 may send a first signal to the power switch 240 to activate the connector 310 such that the output 250 provides power from the power supply 300 to the connector 310 in response to receiving the engagement signal and/or making a positive engagement determination. The processing circuit 210 may be configured to receive a disengagement signal (e.g., a low signal, etc.) from the disengagement sensor and determine that the external device 320 is decoupled from the connector 310. The processing circuit 210 may be configured to send a second signal to the power switch 240 to deactivate the connector 310 in response to receiving the disengagement signal. The processing circuit 210 may be configured to wait a threshold elapsed time (e.g., ten seconds, one minute, etc.) before deactivating the connector 310. The engagement sensor and the disengagement sensor may be separate sensors or a single sensor.

Referring now to FIGS. 4A-4G, schematic circuit diagrams of components (e.g., the processing circuit 210, the activation button 220, the current sensor 230, the power switch 240, the output 250, the connector 310, etc.) of the charging station 10, the energy storage and power supply device 100, and/or the power interrupt system 200 are shown, according to various exemplary embodiments.

The present disclosure contemplates methods, systems, and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

As utilized herein, the terms "approximately", "about", "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the terms "exemplary" and "example" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like, as used herein, mean the joining of two members directly or indirectly to one another. Such joining may be stationary (e.g., permanent, etc.) or moveable (e.g., removable, releasable, etc.). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," "between," etc.) are merely used to describe the orientation of various elements in the figures. It should be noted that the orientation of various elements may differ according to other exemplary embodiments, and that such variations are intended to be encompassed by the present disclosure.

Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

It is important to note that the construction and arrangement of the energy storage and power supply device as shown in the exemplary embodiments is illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies of the components described herein may be constructed from any of a wide variety of materials that provide sufficient strength or durability, in any of a wide variety of colors, textures, and combinations. Accordingly, all such modifications are intended to be included within the scope of the present inventions. Other substitutions, modifications, changes, and omissions may be made in the design, operating conditions, and arrangement of the preferred and other exemplary embodiments without departing from scope of the present disclosure or from the spirit of the appended claims.

The invention claimed is:

1. A power supply device, comprising:
a first electrical connector configured to facilitate electrically coupling a first electronic device to a power source;
a second electrical connector configured to facilitate electrically coupling a second electronic device to the power source;
a first activation button associated with the first electrical connector;
a second activation button associated with the second electrical connector; and
a power interrupt system selectively coupling (i) the power source to the first electrical connector and (ii) the power source to the second electrical connector, the power interrupt system including a switch positioned to selectively couple the power source to the first electrical connector, the power interrupt system configured to:
activate the switch to provide first energy from the power source to the first electrical connector in response to receiving a first activation signal from the first activation button;
start a timer in response to activating the switch;
deactivate the switch in response to the timer reaching a threshold elapsed time to limit the first energy provided to the first electrical connector; and
provide second energy from the power source to the second electrical connector in response to receiving a second activation signal from the second activation button.

2. The power supply device of claim 1, further comprising the power source, the power source configured to at least one of generate, store, and transmit energy.

3. The power supply device of claim 2, wherein the power source includes at least one of an energy storage device configured to store the energy, a solar panel configured to generate the energy, and a mains power connector configured to transmit the energy from a mains power source.

4. The power supply device of claim 1, wherein the power interrupt system is configured to active the switch to provide the first energy from the power source to the first electrical connector in response to (i) receiving the first activation signal and (ii) determining that the first electronic device is coupled to the first electrical connector.

5. The power supply device of claim 1, wherein the first electrical connector is a different type of connector than the second electrical connector.

6. The power supply device of claim 4, wherein the power interrupt system includes an engagement sensor configured to facilitate recognizing when the first electronic device is coupled to the first electrical connector, and wherein the power interrupt system is configured to determine that the first electronic device is coupled to the first electrical connector based on a signal received from the engagement sensor.

7. The power supply device of claim 4, wherein the power interrupt system includes a current sensor configured to facilitate monitoring current being drawn from the first electrical connector, and wherein the power interrupt system is configured to determine that the first electronic device is coupled to the first electrical connector in response to current being drawn from the first electrical connector.

8. A power interrupt system for a power supply device, comprising:
a first switch configured to selectively couple a power source of the power supply device to a first electrical connector of the power supply device;

a second switch configured to selectively couple the power source of the power supply device to a second electrical connector of the power supply device; and a processing circuit configured to:
- activate the first switch in response to receiving a first signal to couple the power source to the first electrical connector such that first energy from the power source is provided to the first electrical connector to facilitate at least one of charging and powering a first electronic device coupled to the first electrical connector;
- deactivate the first switch in response to receiving a second signal to decouple the power source from the first electrical connector such that the first energy is not provided to the first electrical connector from the power source; and
- activate the second switch in response to receiving a third signal to couple the power source to the second electrical connector such that second energy from the power source is provided to the second electrical connector to facilitate at least one of charging and powering a second electronic device coupled to the second electrical connector.

9. The power interrupt system of claim 8, further comprising:
- a first activation button configured to provide the first signal to the processing circuit, the first signal indicating that the first activation button has been engaged by a user; and
- a second activation button configured to provide the third signal to the processing circuit, the third signal indicating that the second activation button has been engaged by the user.

10. The power interrupt system of claim 9, wherein the first activation button is configured to provide the second signal to the processing circuit, the second signal indicating that the first activation button has been disengaged by the user.

11. The power interrupt system of claim 9, further comprising a current sensor configured to provide the second signal to the processing circuit, the second signal indicating that no current is being drawn from the first electrical connector.

12. The power interrupt system of claim 9, further comprising a disengagement sensor configured to provide the second signal to the processing circuit, the second signal indicating that the first electronic device is decoupled from the first electrical connector.

13. The power interrupt system of claim 9, wherein the processing circuit is configured to start a timer in response to activating the first switch, wherein the timer is configured to provide the second signal to the processing circuit in response to the timer reaching a threshold elapsed time.

14. The power interrupt system of claim 8, further comprising an engagement sensor configured to provide the first signal to the processing circuit, the first signal indicating that the first electronic device is coupled to the first electrical connector.

15. The power interrupt system of claim 14, further comprising a current sensor configured to provide the second signal to the processing circuit, the second signal indicating that no current is being drawn from the first electrical connector.

16. The power interrupt system of claim 14, further comprising a disengagement sensor configured to provide the second signal to the processing circuit, the second signal indicating that the first electronic device is decoupled from the first electrical connector.

17. The power interrupt system of claim 14, wherein the processing circuit is configured to start a timer in response to activating the first switch, wherein the timer is configured to provide the second signal to the processing circuit in response to the timer reaching a threshold elapsed time.

18. A method for selectively providing power to electrical connectors of a power supply device, the method comprising:
- receiving, by a processing circuit, a first signal, wherein the power supply device includes at least one of (i) a first activation button configured to provide the first signal to the processing circuit in response to the first activation button being engaged by a user and (ii) a first engagement sensor configured to provide the first signal to the processing circuit in response to a first electronic device being coupled to a first electrical connector;
- activating, by the processing circuit, a first switch in response to receiving the first signal, wherein activating the first switch couples a power source to the first electrical connector such that first energy from the power source is provided to the first electrical connector to facilitate at least one of charging and powering the first electronic device coupled to the first electrical connector;
- receiving, by the processing circuit, a second signal, wherein the power supply device includes at least one of (i) a second activation button configured to provide the second signal to the processing circuit in response to the second activation button being engaged by the user and (ii) a second engagement sensor configured to provide the second signal to the processing circuit in response to a second electronic device being coupled to a second electrical connector;
- activating, by the processing circuit, a second switch in response to receiving the second signal, wherein activating the second switch couples the power source to the second electrical connector such that second energy from the power source is provided to the second electrical connector to facilitate at least one of charging and powering the second electronic device coupled to the second electrical connector;
- receiving, by the processing circuit, a third signal, wherein at least one of (i) the first activation button is configured to provide the third signal to the processing circuit in response to the first activation button being disengaged by the user, (ii) the power supply device includes a current sensor configured to provide the third signal to the processing circuit in response to no current being drawn from the first electrical connector, (iii) the power supply device includes a disengagement sensor configured to provide the third signal to the processing circuit in response to the first electronic device being decoupled from the first electrical connector, and (iv) the processing circuit is configured to start a timer in response to activating the first switch, the timer configured to provide the third signal to the processing circuit in response to the timer reaching a threshold elapsed time; and
- deactivating, by the processing circuit, the first switch in response to receiving the third signal, wherein deactivating the first switch decouples the power source from the first electrical connector such that the first energy is not provided to the first electrical connector from the power source.

\* \* \* \* \*